(12) United States Patent
Kawahara et al.

(10) Patent No.: US 6,434,718 B1
(45) Date of Patent: Aug. 13, 2002

(54) ERROR PROTECTION METHOD AND ERROR PROTECTION DEVICE

(75) Inventors: Toshiro Kawahara; Toshio Miki; Sanae Hotani, all of Kanagawa (JP)

(73) Assignee: NTT DoCoMo Inc., Tokyo (JP)

( * ) Notice: Subject to any disclaimer, the term of this patent is extended or adjusted under 35 U.S.C. 154(b) by 0 days.

(21) Appl. No.: 09/462,800

(22) PCT Filed: May 27, 1999

(86) PCT No.: PCT/JP99/02800

§ 371 (c)(1),
(2), (4) Date: Jan. 10, 2000

(87) PCT Pub. No.: WO99/62181

PCT Pub. Date: Dec. 2, 1999

(30) Foreign Application Priority Data

| May 27, 1998 | (JP) | 10-146191 |
| May 27, 1998 | (JP) | 10-146192 |
| Dec. 4, 1998 | (JP) | 10-346016 |

(51) Int. Cl.[7] .............................. H03M 13/35
(52) U.S. Cl. ......................... 714/774; 714/776
(58) Field of Search .................. 714/774, 776

(56) References Cited

U.S. PATENT DOCUMENTS

| 5,128,942 A | * 7/1992 | Kojima ............... 714/708 |
| 6,141,781 A | 10/2000 | Mueller .............. 714/722 |

(List continued on next page.)

FOREIGN PATENT DOCUMENTS

| DE | 196 05 418 A | 8/1987 |
| JP | 62-117423 A | 5/1987 |

(List continued on next page.)

OTHER PUBLICATIONS

Weck C, "Optimierung Der Empfangqualitat Durch Angepassten Fehl Erschutz Bei Dab", Itg–Fachberrichte, De, Vde Verlag, Berlin, vol. 118, Feb. 18, 1992.

(List continued on next page.)

*Primary Examiner*—Stephen M. Baker
(74) *Attorney, Agent, or Firm*—Brinks Hofer Gilson & Lione

(57) ABSTRACT

The frame-forming data computing part 101 sorts a plurality of types of parameters forming the frames, and generates frame-forming data that contains data relating to the configuration of said frames and data establishing for each class the error protection method to be applied to each said parameter. The frame-forming data error protection processing part 102 implements the specified error protection for said frame-forming data. The class data error protection processing part 103 implements error protection that is specified for each class according to the frame-forming data, with respect to the parameters that are sorted into a plurality of classes. The synthesizer 104 transmits the frame-forming data that has undergone the specified error protection and the parameters that have undergone the error protection established for each class. In accordance with the present invention, error correction is implemented on frame-forming data indicating the configuration of the frames, and it is also implemented on each class according to the frame-forming data, and these two are synthesized and output. Therefore, it becomes possible to obtain data relating to the configuration of said frames, according to frame-forming data received by the receiving side device. As a result, it is possible to set on the transmission side as desired the content of the error protection to be applied to each class, and in addition, error protection becomes possible for each frame, due to the fact that these data are contained in the frame-forming data, even if the frame has a variable frame length, with the number of bits fluctuating over time.

12 Claims, 12 Drawing Sheets

U.S. PATENT DOCUMENTS

| | | | |
|---|---|---|---|
| 6,167,060 A | * 12/2000 | Vargo et al. | 370/468 |
| 6,170,073 B1 | * 1/2001 | Jarvinen et al. | 714/752 |
| 6,223,324 B1 | * 4/2001 | Sinha et al. | 714/774 |
| 6,233,713 B1 | * 5/2001 | Van Den Berghe et al. | 714/774 |
| 6,292,917 B1 | * 9/2001 | Sinha et al | 375/299 |
| 6,330,644 B1 | * 12/2001 | Yamashita et al. | 345/541 |
| 6,345,126 B1 | * 2/2002 | Vishwanath et al. | 375/240.22 |
| 6,353,637 B1 | * 3/2002 | Mansour et al. | 370/536 |
| 6,356,545 B1 | * 3/2002 | Vargo et al. | 370/355 |

FOREIGN PATENT DOCUMENTS

| | | |
|---|---|---|
| JP | 02-280490 A | 11/1990 |
| JP | 05-191362 A | 7/1993 |
| JP | 06-204983 A | 7/1994 |

OTHER PUBLICATIONS

Naoto Matoba et al. "Still Inage Transmission Using Unequal Error Protection Coding in Mobile Radio Channel", Electronics & Communications in Japan, Part 1—Communications, Scripta Technica, New York, US, vol. 79, part 1, No. 4, Apr. 1, 1996.

Pelz R M, "An Unequal Error Prtected PX8 KBIT/S Video Transmission for Dect", proceeding o fthe vehicular technology conference, US, New York, IEEE, vol. Conf. 44, Jun. 8, 1994.

* cited by examiner

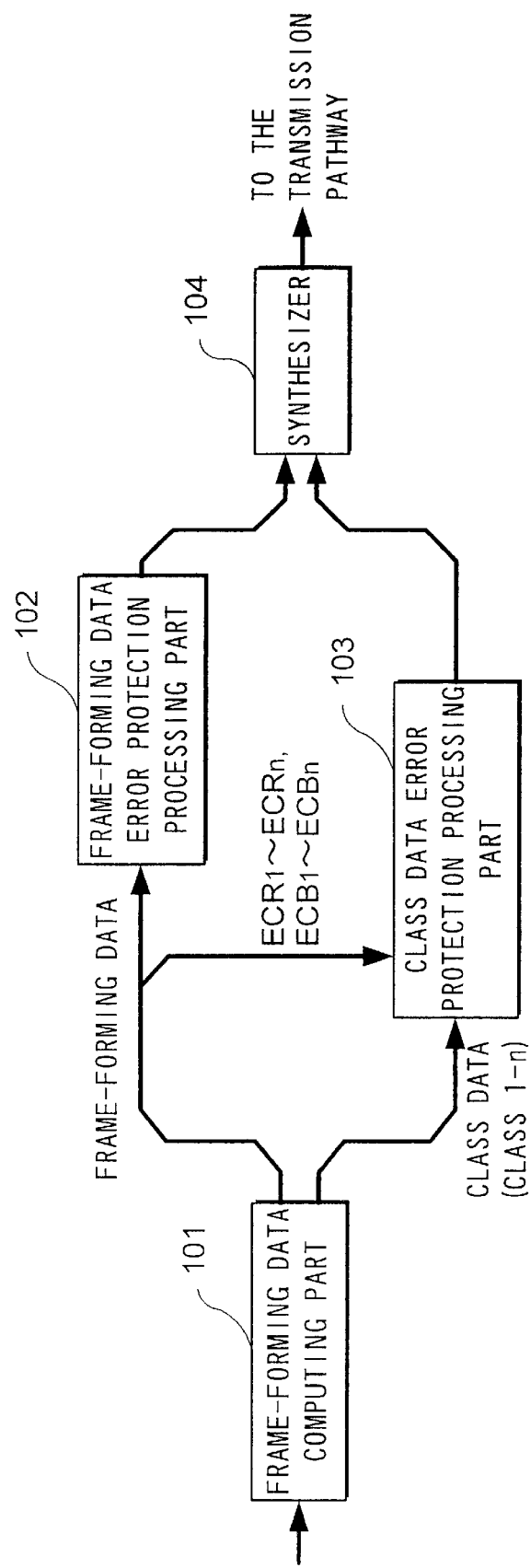

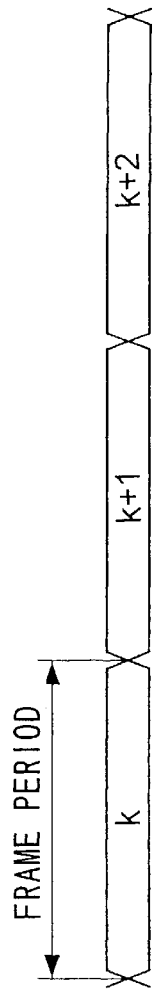
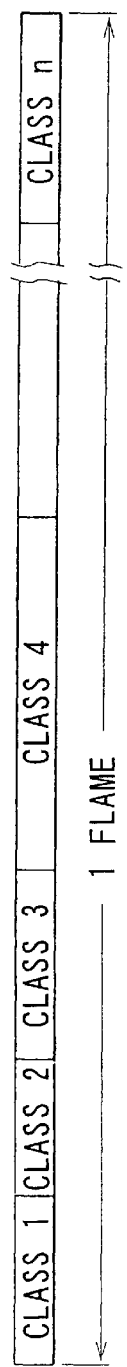
FIG. 2A  VOICE SAMPLE
FIG. 2B  PARAMETER GROUPS
FIG. 2C

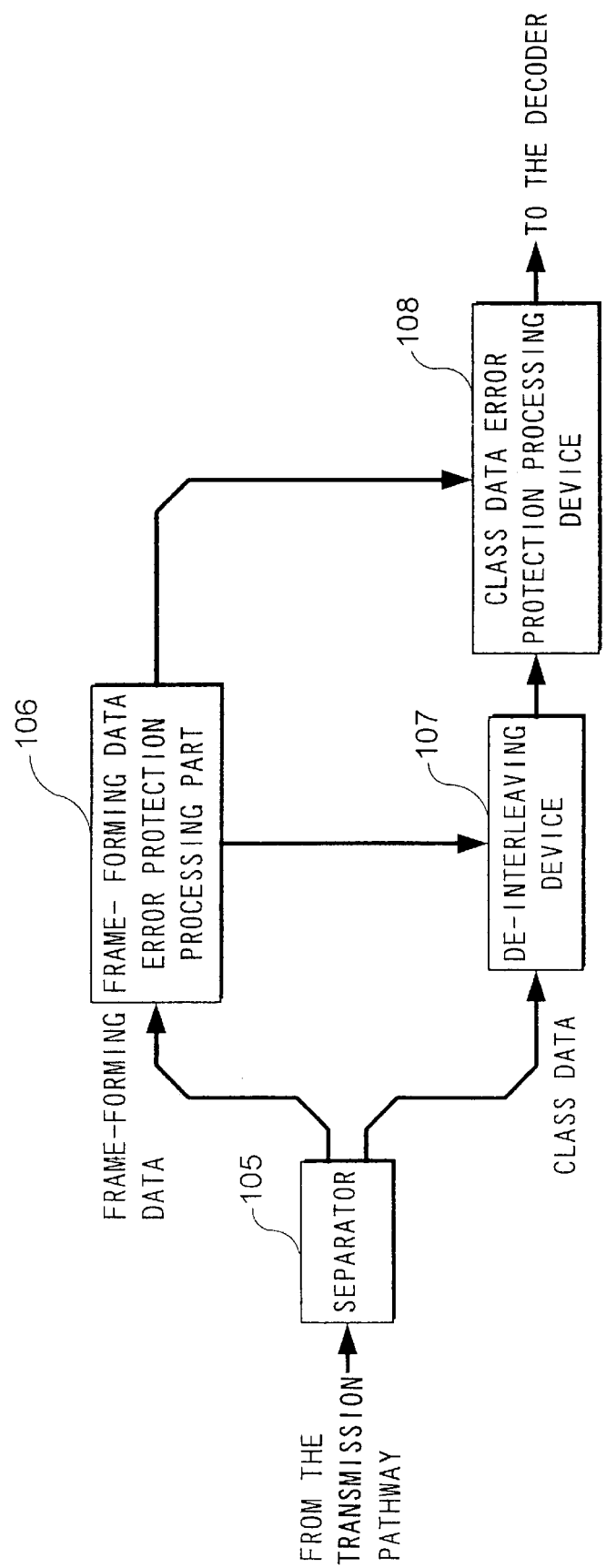

WRITING ORDER AT THE TIME OF INTERLEAVING
(READING ORDER AT THE TIME OF DE-INTERLEAVING)

READING ORDER AT THE TIME OF INTERLEAVING
(WRITING ORDER AT THE TIME OF DE-INTERLEAVING)

BEFORE INTERLEAVING

AFTER INTERLEAVING

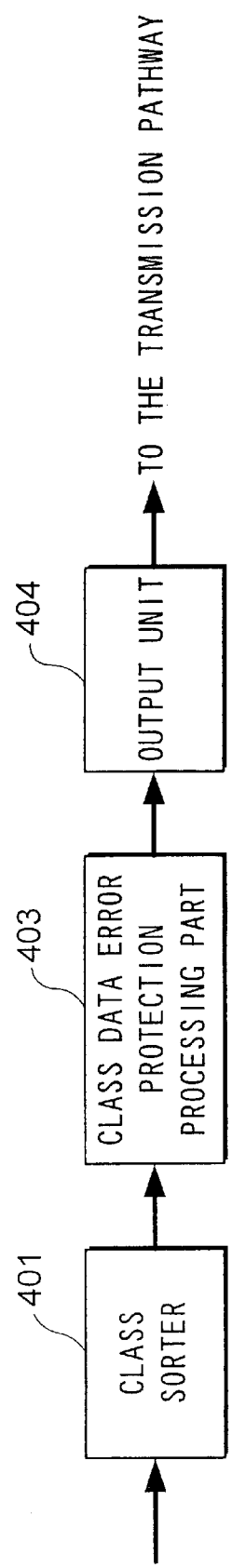

ERROR PROTECTION METHOD AND ERROR PROTECTION DEVICE

TECHNICAL FIELD

The present invention relates to an error protection method and an error protection device that protects a variety of data from signal errors in the process of transmission.

BACKGROUND ART

Error protection has been performed on data such as voice and images to protect it from signal errors while being transmitted. A variety of error protection methods have been employed, such as PDC half-rate, Twin-VQ, and the like.

In addition, the error protection methods of the prior art were applied to fixed length frames with the same number of bits per frame, or to quasi-fixed length frames where frames of a limited variety of bit lengths only were to be found.

In the prior art error protection method, the error sensitivity was examined for each parameter (including bits) making up the frame, and in the case of parameters with high sensitivity, error protection of a specified type (e.g., the addition of an error detection code or error correction encoding) was performed on frames containing parameters with high sensitivity at the time of transmitting the frames. Here, the error sensitivity of the parameter is of a degree that would degrade the results of decoding obtained on the receiving side, in the case where a single error bit occurred in the process of transmitting said parameter.

FIG. 13 shows an example of the configuration of a prior art error protection device. In this figure, a class sorter 401 takes the frame that is to be error protected, and sorts the parameters of the frame into classes according to their respective degrees of error sensitivity.

In the case of this error protection device, the error protection method, namely either error correction encoding at a specified encoding ratio, or the addition of a specified error detection code, is determined for each class.

A class data error protection processing part 403 implements the error correction encoding or adds an error detection code, according to the error protection method determined in response to the various classes, with respect to the various parameters classified into said classes. Specifically, convolution is carried out for error correction encoding, and cyclic redundancy encoding is carried out to produce an error detection code. Furthermore, an output device 404 performs interleaving and the like on the data that undergoes error correction encoding or to which is added an error detection code, and sends the data to the recipient.

Incidentally, in the case of the prior art error correction device, previously established error protection was carried out for each class. Thus, the prior art error-correcting device had the drawbacks of low flexibility in methods of protection and poor general applicability.

Moreover, the prior art error protection device also had the drawback that it was unable to protect a variable length frame, the number of constituent bits thereof fluctuating with time, since it could protect only the fixed length frames or quasi-fixed length frames as mentioned above.

DISCLOSURE OF INVENTION

The present invention was devised in light of the above-described state of affairs, and has as its object to provide an error protection method and an error protection device that makes it possible to employ a variety of error-correcting algorithms, even when the frames are of a flexible length.

In order to achieve said object, the error protection method relating to the present invention includes a process for sorting a plurality of parameters making up a frame into a plurality of classes, a process for generating frame-forming data containing data relating to the formation of said frame and data with an error protection method determined for each class to be applied to the said parameters, a process for implementing the specified error protection to said frame-forming data, a process for implementing error protection specified for each class according to the said frame-forming data, with respect to the data sorted into the said plurality of classes, and a process for transmitting the frame-forming data that has undergone said specified error protection and parameters that were error protected for each said class.

In accordance with the invention, since the parameters are divided into classes, and since the devices are arranged separately so there is a device for generating frame-forming data indicating the content of the error protection to be performed for each class, and a device for performing protection corresponding to each class according to the frame-forming data, it is possible to adjust to changes in the content of the error protection to be applied to each class.

Furthermore, since frame-forming data is transmitted that indicates what type of error protection is suited for each class, the content of the error protection that is to be applied to each class is taken from this frame-forming data by the receiving side device, making it possible to respond appropriately. Therefore, there is no need to fix the content of the error protection, and it becomes possible to switch the error protection content between the transmission side device and the receiving side device, as expediency may dictate. In addition, since the frame-forming data contains data pertaining to the formation of frames, it is possible to implement the processing of variable length frames that have undergone error protection by the receiving side device.

BRIEF DESCRIPTION OF DRAWINGS

FIG. 1 is a block diagram showing a configuration of an error protection device relating to the first embodiment of the present invention.

FIGS. 2A–2C are time charts showing the operation of said embodiment.

FIG. 3 is a block diagram showing a configuration of a receiving side device in said embodiment.

FIG. 13 is a block diagram showing a configuration of a prior art error protection device.

BEST MODE FOR CARRYING OUT THE INVENTION

Figure 4:
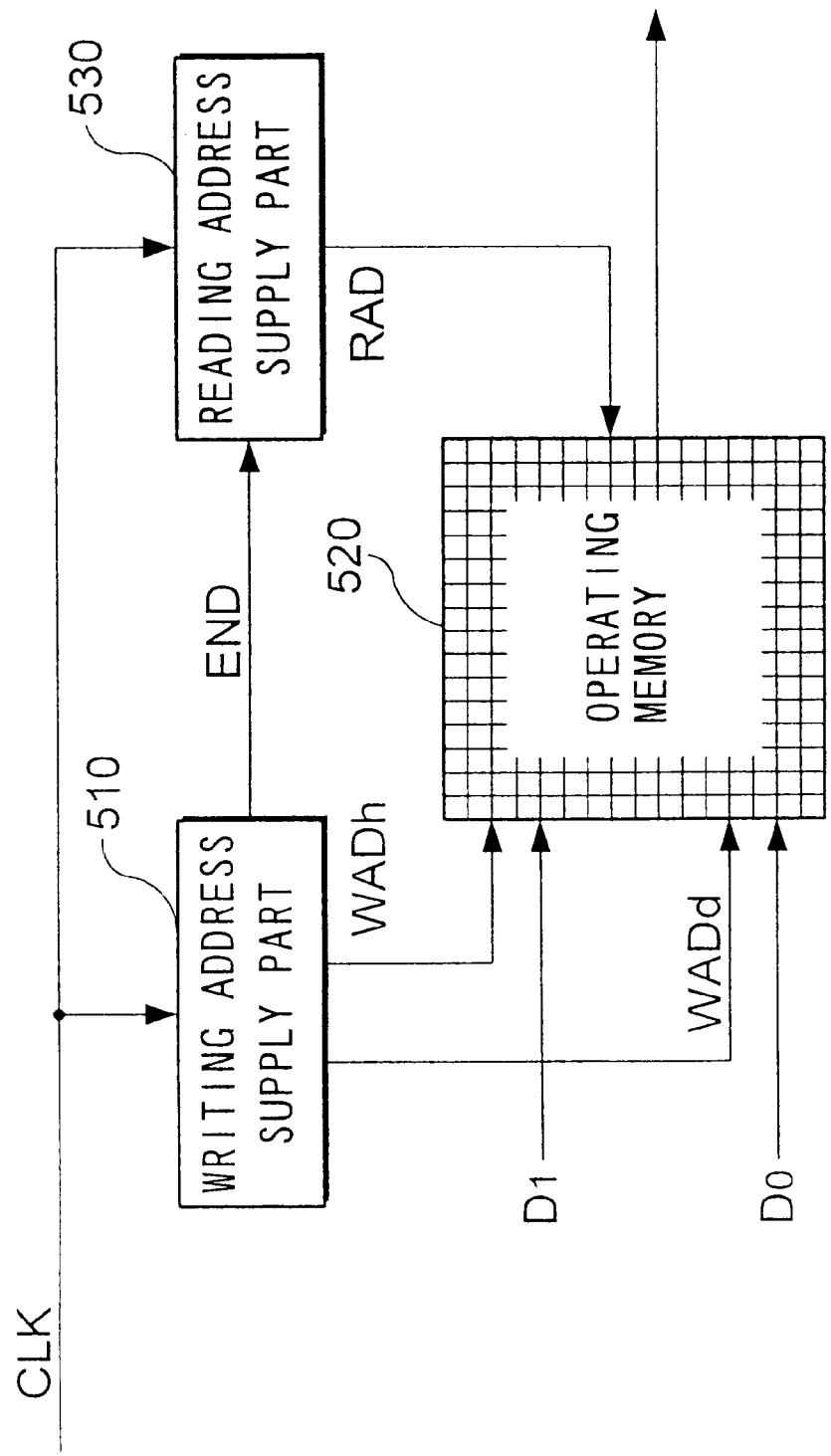
FIG. 4 is a block diagram showing a configuration of an interleaving device provided to a synthesizing device of said error protection device.

Following is a description of embodiments of the present invention, presented with reference to drawings.

A. First Embodiment (1) The Error Protection Device

FIG. 1 is a block diagram showing a configuration of an error protection device relating to the first embodiment of the present invention.

This error protection device is provided inside or connected downstream to an encoder that performs compression encoding of voice signals.

Sample sequences of voice signals to be transmitted can be produced at any time by this encoder. In addition, as shown in FIGS. 2A and 2B, compression encoding of sample sequences of voice signals belonging to the various frame cycles is performed, with a fixed frame cycle as a processing unit, producing a plurality of types of parameters. Here, the volume of data of the parameter groups formed varies for each frame cycle.

With respect to the various parameter groups, the error protection device relating to the present embodiment performs error protection appropriate for each parameter and performs their outputting.

As shown in FIG. 1, the error protection device relating to the present embodiment possesses a frame-forming data computing part 101, a frame-forming data error protection processing part 102, a class data error correction processing part 103, and a synthesizer 104.

The frame-forming data computing part 101 serves primarily to perform the next processing.

a. Class Division of Parameter Groups

The parameters produced by the encoder include some with high error sensitivity and some with low error sensitivity. Here, since parameters with high error sensitivity have a low acceptable residual error ratio, it is recommendable to reduce the residual error ratio on the receiving side by implementing encoding by means of an error-correcting code with a high encoding ratio. On the other hand, with regard to parameters with low error sensitivity, there should be no need for error correction encoding at such a high encoding ratio. Furthermore, depending on the parameter, there will be some cases where it is sufficient simply to add an error detection code, rather than to perform such error correction encoding. Moreover, some of these parameters are to be interleaved, and some are not. Thus, different error protection methods are to be applied to different cases, depending on the type of parameter.

Accordingly, in the present embodiment, parameters produced by the encoder are sorted into classes according to the error protection method to be applied in each case. In addition, in the error protection device shown in FIG. 1, the frame-forming data computing part 101 performs the sorting into classes.

In the example shown in FIG. 1, n classes are prepared, from class 1 to class n. The type of error protection applied to the parameters belonging to these classes is determined beforehand in the transmission side device. Furthermore, the type of parameters belonging to the classes is also determined beforehand. Furthermore, it is also possible to modify as desired the content of the error protection applied to the various classes by means of the transmission side device. The frame-forming data computing part 101 judges the class belonging to each parameter formed by the encoder according to the type of each parameter, by following the decision criteria in the transmission side device. It should be noted that for the sake of convenience, the parameters that have been attached to the various classes by sorting should hereinafter be referred to as the class data of each class.

b. Production of Frame-Forming Data

The frame-forming data computing part 101 determines the total number of bits of the parameters produced by the encoder within 1 frame cycle, and outputs the data $Cb_1$–$Cb_n$ indicating the number of bits of class data of each class 1–n.

Furthermore, in addition to outputting the data $Cb_1$–$Cb_n$ indicating the number of bits of class data of each class, the frame-forming data computing part 101 also outputs the data $CC_1$–$CC_n$ indicating the error protection content applied to the class data of each class.

Each of the data $CC_1$–$CC_n$ includes, for example, an encoding algorithm for error encoding and data as to whether or not interleaving was performed and the type of the interleaving if performed.

Moreover, the frame-forming data computing part 101 outputs the data $ECR_1$–$ECR_n$ indicating an encoding rate in cases where error correction is implemented for class data of each class 1–n. The data $ECR_1$–$ECR_n$ is determined based on a residual error ratio for class data of each class.

Moreover, the frame-forming data computing part 101 outputs the data $EDB_1$–$EDB_n$ indicating the number of bits of an error detection code in cases where an error detection code (e.g., bits of cyclic redundancy code) is added to class data for each class 1–n. The number of these bits is determined based on the error sensitivity of the class data of each class.

For example, in cases where the error sensitivity of the class data of a class is low, and it is conceivable that even though a bit error occurs, the effect on the receiving side would be low, so the number of bits of the error detection code for that class is set at zero. On the other hand, in cases where a class data bit error occurs when it is conceivable that the effect on the receiving side would be high, then the number of bits of the error detection code for that class is determined in reference to the number of bits to be protected (i.e., the number of bits of that class).

The data $Cb_1$–$Cb_n$, $CC_1$–$CC_n$, $ECR_1$–$ECR_n$, and $EDB_1$–$EDB_n$ output accordingly by the frame-forming data computing part 101 are all data pertaining to the class that forms the frame, and are thus generically referred to as frame-forming data.

Next, the frame-forming data error protection processing part 102 performs specified error correction with respect to the frame-forming data output by the frame-forming data computing part 101, that is to say, it performs error correction of a type that is predetermined with the recipient. In this case, the frame-forming data error protection processing part 102 can perform error correction encoding of frame-forming data, or it can simply add an error detection code.

The class data of the classes sorted into classes 1–n by the frame-forming data computing part 101 are supplied to the class data error protection processing part 103. FIG. 2C shows examples of such class data. The class data error protection processing part 103 performs on the received class data of each class error correction encoding of the type designated in the frame-forming data, or it adds an error detection code to class data of each class 1–n.

That is to say, in cases where error correction encoding is to be performed on the class data of a certain class k, through the use of an encoding algorithm designated by the data $CC_k$, the class data error protection processing part 103 executes error correction encoding of said class data by said encoding algorithm, at an encoding ratio designated by the data $ECR_k$ corresponding to said class k. Furthermore, in cases where the data $EDB_k$ corresponding to some class k is not 0, the class data error protection processing part 103 generates an error detection code with the number of bits designated by the data $EDB_k$ from the class data of said class k, and adds it to said class data.

The synthesizer 104 gathers the frame-forming data that has undergone error protection by the frame-forming data error protection processing part 102 and the class data that has undergone error correction by the class data error protection processing part 103, synthesizes them, and transmits them to the receiving side device via the transmission pathway.

Among the classes 1 to n there are classes that have been designated for interleaving. Interleaving for these classes is performed by this synthesizer 104. The following two types of interleaving methods are available for cases such as this.
a. The arrangement of bits into each class designated for interleaving;
b. The bits belonging to the class designated for interleaving are scattered and arranged in the bit sequence of another class.

The data $CC_k$ corresponding to class k designates which type of interleaving is performed. Furthermore, regarding class k in performing interleaving according to method b, the other class (e.g., class j) with which the bits forming said class k are scattered and arranged, is designated by the data $CC_k$.

It should be noted that a detailed description will ensue regarding the device for interleaving according to method b.

The frame-forming data that has undergone error protection is added to the classes as headers, and the variable length frames formed from the headers and parameters are transmitted to the receiving side device via the transmission pathway.

It should also be noted that the frame-forming data, instead of being transmitted as headers, can also be transmitted to a receiving side device via communication channels that differ from those over which the frames formed from the class data of the various classes are transmitted.

(2) The Receiving Side Device

As shown in FIG. 3, the receiving side device is a device formed from a separator 105, a frame-forming data error protection processing part 106, a de-interleaving device 107, and a class data error protection processing part 108, and located upstream from the decoder.

The separator 105 separates the frames that are output by the synthesizer 104 of the transmission side into frame-forming data and class data.

The frame-forming data error protection processing part 106 carries out error correction decoding or error detection for the frame-forming data output from the separator 105. Processing that is performed by this frame-forming data error protection processing part 106 corresponds to the processing performed by the frame-forming data error protection processing part 102 of the transmission side. That is to say, in cases where the frame-forming data error protection processing part 102 of the transmission side performs the encoding of frame-forming data by means of a specified error-correcting code, this frame-forming data error protection processing part 106 performs on the frame-forming data an error-decoding corresponding to said error-correcting code. Furthermore, in cases where the frame-forming data error protection processing part 102 of the transmission side adds an error detection code of a specified number of bits to the frame-forming data, this frame-forming data error protection processing part 106 employs the error detection code to detect errors in the frame-forming data.

The frame-forming data error protection processing part 106 outputs frame-forming data for which error correction decoding or error detection has been completed.

The de-interleaving device 107 performs de-interleaving on class data that has been interleaved, making reference to the data $CC_1$–$CC_n$, among this frame-forming data.

That is to say, in cases where it has been determined from the data $CC_k$ corresponding to the class k that there has been interleaving of the type that arranges bits into said class k, the de-interleaving device 107 performs the reverse operation of arranging those bits, and restores the class data to its original state prior to the bit arrangement.

Furthermore, in cases where it has been determined from the data $CC_k$ corresponding to the class k that there has been interleaving of the type that scatters the bits forming said class k and arranges them within a bit sequence of another class j, the de-interleaving device 107 removes the bits corresponding to class k from the bit sequence of class j, and restores the class data of classes k and m to the state prior to the interleaving.

The device for executing the latter type of de-interleaving is described in detail below.

The de-interleaving device 107 supplies the de-interleaved class data for each class to the class data error protection processing device 108.

The data needed for class data error correction decoding or error detection, such as the number of bits of each class, the encoding ratio of each class, the number of bits of each class error detection code, the encoding algorithm of each class, and the like, are supplied from the frame-forming data error protection processing part 106 to this class data error protection processing device 108.

The class data error protection processing part 108 implements error correction decoding or error detection for each class data, in accordance with these data, and delivers the class data that has been processed to the decoder.

If the error protection device relating to the present embodiment is employed as described above, it is possible to respond with flexibility to changes in the error protection content to be applied to each class, since the configuration is such that it is separated into a device that generates frame-forming data indicating the content of the error protection to be applied to each class that is obtained through the sorting of the parameters, and a device that performs error protection corresponding to each class, in accordance with this frame-forming data.

Furthermore, according to the present embodiment, since the frame-forming data containing data indicating the content of the error protection to be applied to each class is transmitted from the transmission side to the receiving side device, the content of the error protection to be applied to each class as indicated by the frame-forming data is determined by the receiving side device. It is thus possible to perform error correction decoding, error detection, or de-interleaving of the class data. Therefore, there is no need to fix the content of the error protection to be applied to each parameter that is transmitted, and it becomes possible to transmit frames, switching the error protection content between the transmission side device and the receiving side device, as expediency may dictate. In addition, since the receiving side device is informed of said configuration by means of the frame-forming data, it is possible for the receiving side device to properly execute error correction decoding, error detection, or de-interleaving of class data for each class, even if the frame has a variable frame length, with the number of bits fluctuating over time.

(3) The Interleaving Device and the De-Interleaving Device

FIG. 4 is a block diagram showing an example of a configuration of an interleaving device provided to the synthesizing device 104 of the transmission side in said embodiment.

This interleaving device is a device that performs interleaving by scattering the bits forming the class data of a class k, arranging them within the bit sequence of the class data of another class j.

Here, in the case where the bit sequence of class data of class k is $D_1$ and the bit sequence of the class data of class j is $D_0$, the bits forming the bit sequences $D_1$ and $D_0$ are supplied to the interleaving device synchronously with the bit clock CLK.

As shown in FIG. 4, this interleaving device includes as primary structural elements a writing address supply part 510, an operating memory 510, and a reading address supply part 530.

Here, the operating memory 520 is a storage device for storing the bit sequences $D_1$ and $D_0$ which are to be interleaved. In the present embodiment, a plurality of storage areas with continuous addresses are selected for use from all of the storage areas of the operating memory 520, and the bits are stored in their respective storage areas.

It should be noted that in the following discussion, the bit sequence $D_1$ of class k is formed from p bits, and the bit sequence $D_0$ is formed from m×p bits.

Interleaving consists of the process of sequential writing of the bits of the bit sequences $D_1$ and $D_0$ to the operating memory 520, and the process of reading the bits from this operating memory 520 in a sequence that differs from when they were written.

The writing address supply part 510 is a device that executes a specified address-generating program in order to generate synchronously with the time clock CLK the writing address WADh that specifies the writing destination of the bits forming the bit sequence $D_1$, and the writing address WADd that specifies the writing destination of the bits forming the bit sequence $D_0$, and supplies them to the operating memory 520, when the bits are written to the operating memory 520.

Furthermore, when all of the writing addresses needed for writing the bits into the operating memory 520 are no longer being generated, the END symbol indicating this is supplied to the reading address part 530.

The reading address supply part 530 is a device that generates the reading address RAD for reading the bits recorded in the operating memory 520, generating it synchronously with the bit clock CLK by executing a specified address-generating program when the END symbol is received, and supplies the reading address RAD to the operating memory 520

Figure 5:
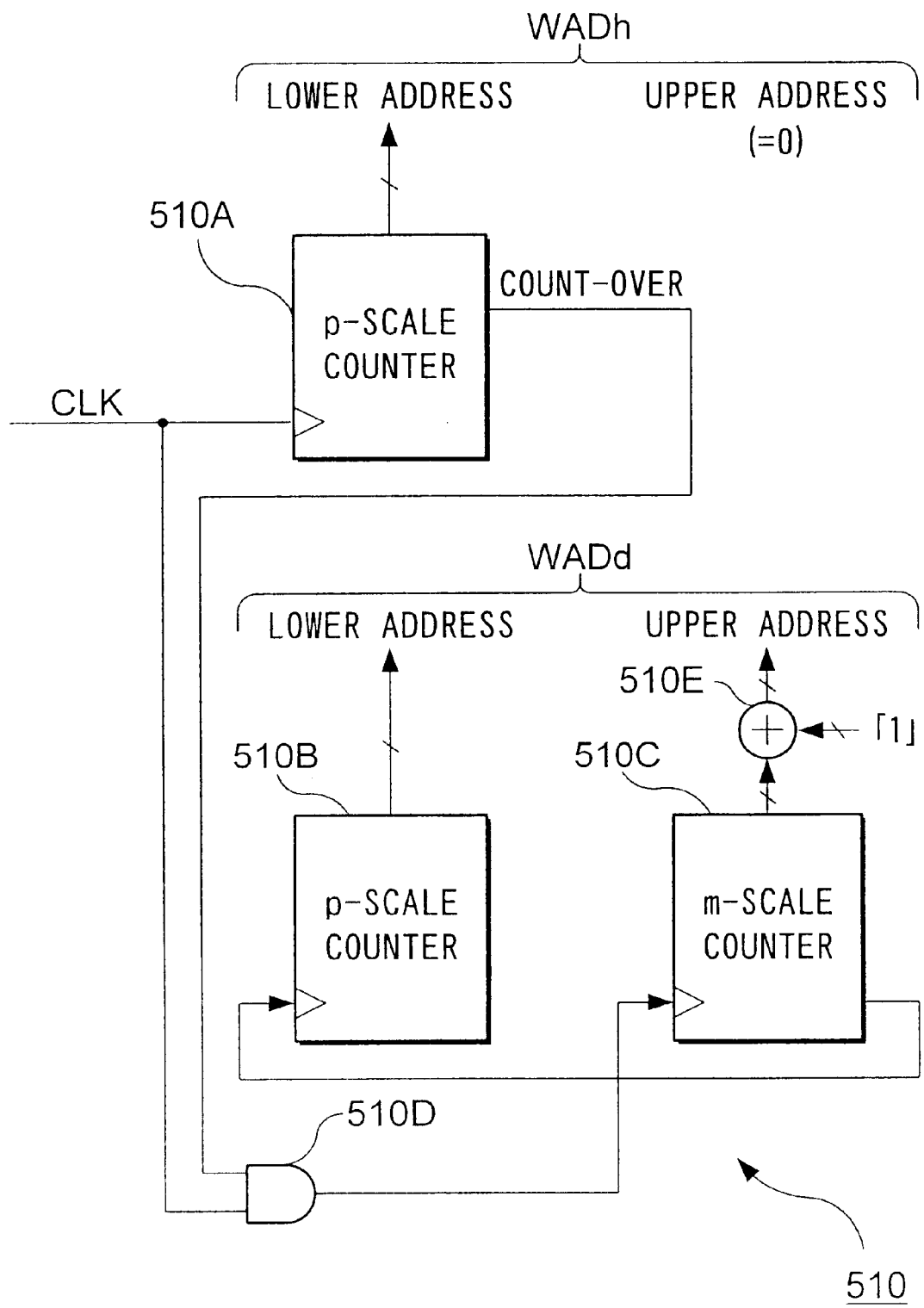
FIG. 5 is a block diagram showing a sample configuration of the writing address supply part of said interleaving device.

FIG. 5 is a block diagram showing the address-generating algorithms executed by the writing address supply part 510 from the standpoint of hardware.

The address-generating algorithm according to this writing address supply part 510 is formed from a p-scale counter 510A, a p-scale counter 510B, an m-scale counter 510C, an AND gate 510D, and an adder 510E. Here, the p-scale counter 51OA counts the bit clock CLK. The writing address WADh for the bits forming the bit sequence $D_1$ has a lower address with a counter value of the p-scale counter 510A, and an upper address designated as "0".

The p-scale counter 510A stops the counting of the bit clock CLK when the count value changes p number of times, yielding a count-over.

The AND gate 510D supplies the bit clock CLK to the m-scale counter 510C, after the p-scale counter 510A yields a count-over.

The m-scale counter 510C carries out counting of the bit clock CLK supplied via this AND gate 510D. The count value of the m-scale counter SIOC yields a count-over when it changes m times, but after that, as long as the bit clock CLK is supplied, the count is repeated again from the initial value "0". The p-scale counter 510B adds counting values "1" at a time each time the m-scale counter 510C yields a count-over. The adder 510E adds "1" to the count value of the m-scale counter 510C and transmits the result.

The writing address WADd that specifies the writing destination of the bits forming the bit sequence $D_0$ is such that the count value of the p-counter 510B is a lower address and the output data of the adder 510E is an upper address.

Figure 6:
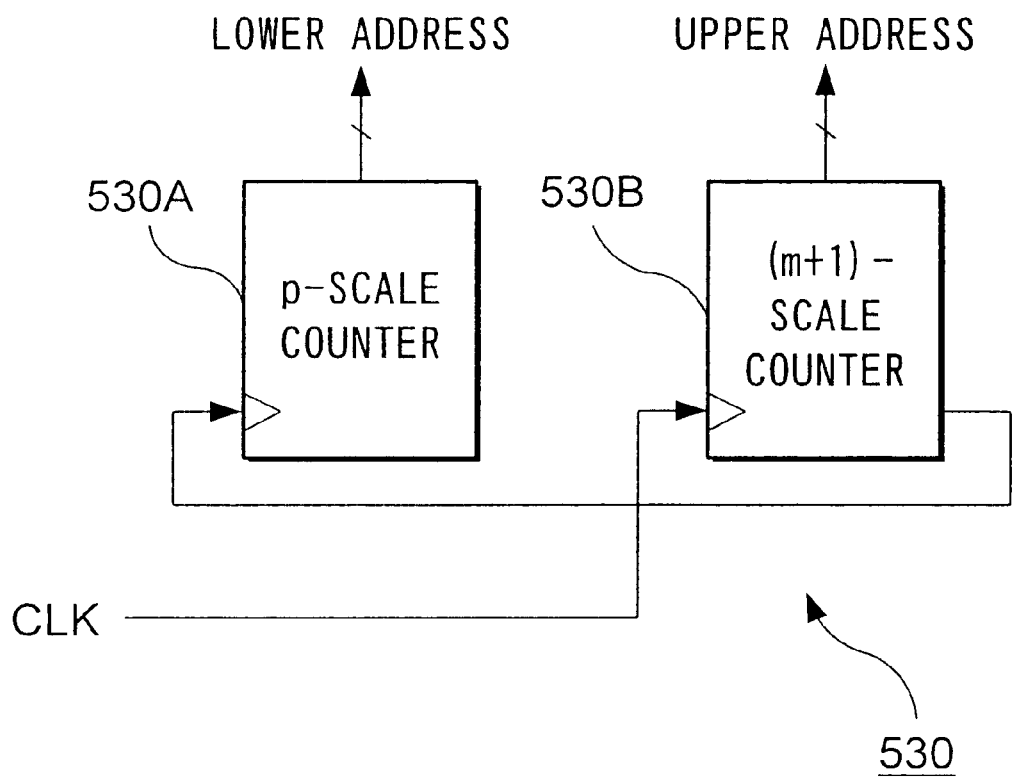
FIG. 6 is a block diagram showing a sample configuration of the reading address supply part of said interleaving device.

FIG. 6 is a block diagram showing a sample configuration of the reading address supply part 530. This reading address supply part 530 is formed from a p-scale counter 530A and an (m+1)-scale counter 530B. The (m+1)-scale counter 530B carries out counting for the bit clock CLK. The p-scale counter 530A increments its counter value by "1" each time the count of the (m+1)-scale counter 530B changes m+1 times and returns to the initial value "0".

The read address RAD is such that the count value of this p-scale counter 530A is a lower address, and the count value of the (m+1)-scale counter 530B is an upper address.

The above is a detailed description of the configuration of the interleaving device.

Figure 7:
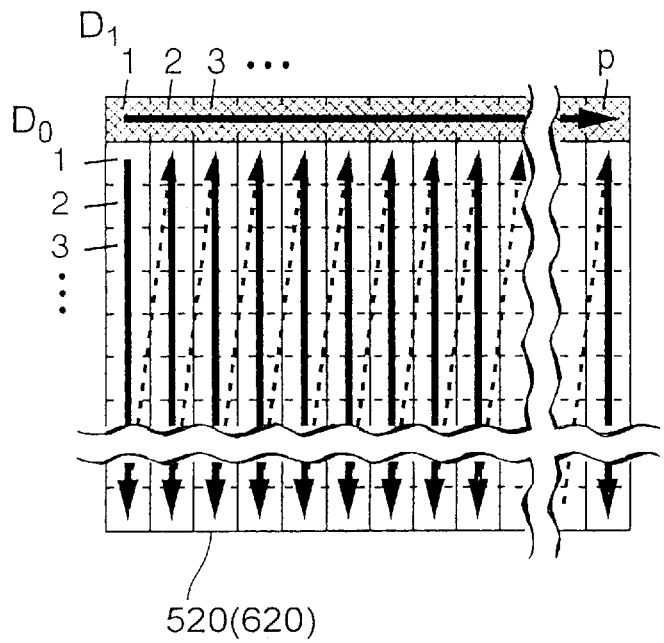
FIG. 7 is a diagram showing the sequence of writing the bits forming a frame at the time of interleaving into the various storage areas of operating memory, and the sequence of reading the bits forming a frame at the time of de-interleaving from the various storage areas of operating memory in said embodiment.
Figure 8:
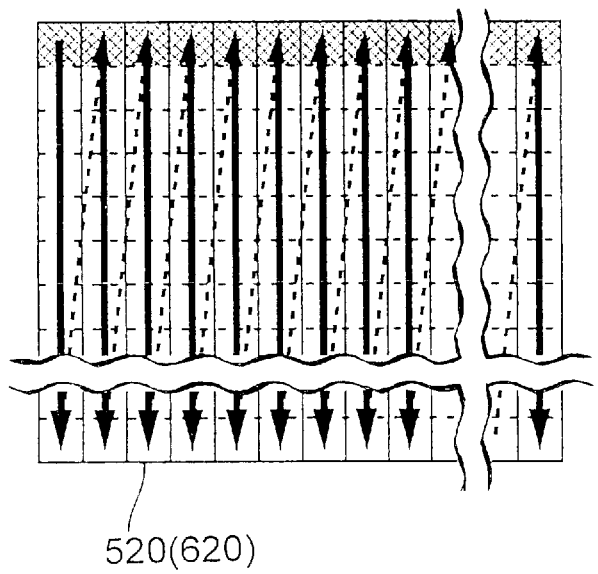
FIG. 8 is a diagram showing the sequence of reading of the bits forming a frame at the time of interleaving from the various storage areas of operating memory, and the sequence of writing the bits forming a frame at the time of de-interleaving into the various storage areas of operating memory in said embodiment.

Following is a description of interleaving implemented by this interleaving device, with reference to FIG. 7 and FIG. 8.

In this interleaving device, interleaving is implemented by using (m+1)×p continuous storage areas in the operating memory 520.

FIG. 7 and FIG. 8 show the storage area for interleaving expressed as a two-dimensional memory space. The various individual addresses correspond to the storage areas in this memory space. An address is formed from a lower address which can take p combinations of values, and an upper address which can take (m+1) combinations of values.

In FIG. 7 and FIG. 8, the storage areas which are to have identical upper addresses are arranged from left to right in lower address order, and the storage areas which are to have identical lower addresses are arranged from top to bottom in upper address order. As stated above, a series of storage areas with identical upper addresses shall be called rows, and a series of storage areas with identical lower addresses shall be called columns.

In implementing interleaving, first of all, the bit sequences that are to be interleaved are written sequentially, each in their respective m×n storage areas, one bit at a time. When this writing is executed, the writing addresses are generated by the writing address supply part 510 described above with reference to FIG. 5.

While the p bits forming the bit sequence $D_1$ are being supplied to the operating memory 520 synchronously with the bit clock CLK, the bit clock CLK counting is carried out according to the p-scale counter 510A in the writing address supply part 510. Also, the writing address WADh is generated, containing the count value of the p-scale counter 510A as a lower address, and "0" as an upper address, and it is supplied to the operating memory 520 synchronously with the bit clock CLK.

Consequently, as shown in FIG. 7, the p bits forming the bit sequence $D_1$ are written into the initial row within the storage area of the operating memory 520 for interleaving.

Next, following the bit sequence $D_1$, the m×p bits forming the bit sequence $D_0$ are supplied to the operating memory 520 synchronously with the bit clock CLK.

In the meantime, the counting of the bit clock CLK is carried out by the m-scale counter 510C in the writing address supply part 510, and in addition, a count value increment of the p-scale counter 510B is executed each time the m-scale counter 510C yields a count-over. Moreover, a writing address WADd is generated that contains the count value of the p-scale counter 510B as a lower address, and a "1" added to the count value of the m-scale counter 510C as an upper address, and this writing address is supplied to the operating memory 520 synchronously with the bit clock CLK.

Consequently, as shown in FIG. 7, the initial m bits from among the m×p bits forming the bit sequence $D_0$ are written into each storage area corresponding to the (m+1)th row, from the second row of the first column, and into the operating memory 520, and then the m bits are written into each storage area corresponding to the (m+1)th row, from the second row of the second column, and so forth, until the final m bits (i.e., the pth bit) are written into each storage area corresponding to the (m+1)th row, from the second column of the pth column.

Next, the bits that are thusly written into the operating memory 520 are read in a sequence that differs from when they were written.

In this reading operation, reading addresses are generated by the reading address supply part 530 described with reference to FIG. 6.

That is to say, the counting of the bit clock CLK is carried out by the (m+1)-scale counter 530B, and in addition, a count value increment with a count value of "1" only of the p-scale counter 530A is executed each time the (m+1)-scale counter 530B yields a count-over. Moreover, a reading address that contains the count value of the p-scale counter 530A as a lower address, and the count value of the (m+1)-scale counter 530B as an upper address is supplied to the operating memory 520 synchronously with the bit clock CLK.

Consequently, as shown in FIG. 8, first of all, the (m+1) bits recorded in each storage area of the first column in the operating memory 520 are read, and then the (m+1) bits recorded in each storage area of the second column are read, and so forth, until finally, the (m+1) bits recorded in each storage area of the pth column are read.

Figure 9A:
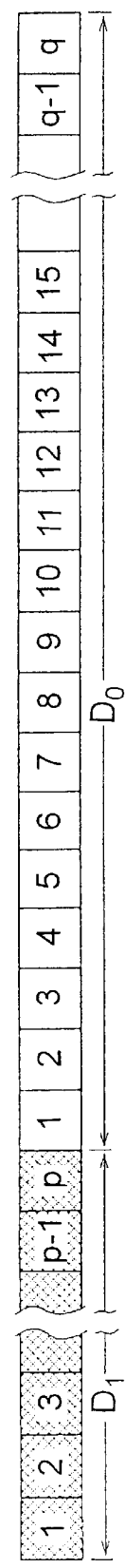
FIGS. 9A and 9B are time charts showing the operation of the interleaving device of said embodiment.
Figure 9B:
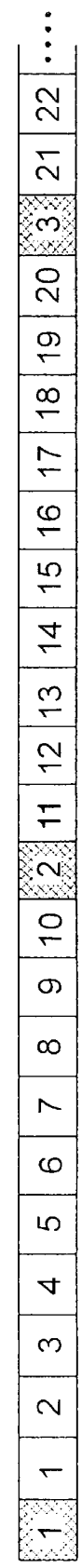

Due to the above-described interleaving, the p bits forming the bit sequence $D_1$ are scattered and arranged at equal intervals within the bit sequence $D_0$, as shown in FIGS. 9A and 9B.

The above was a detailed description of the interleaving device.

Following is a description of the de-interleaving device provided to the receiving side device.

Figure 10:
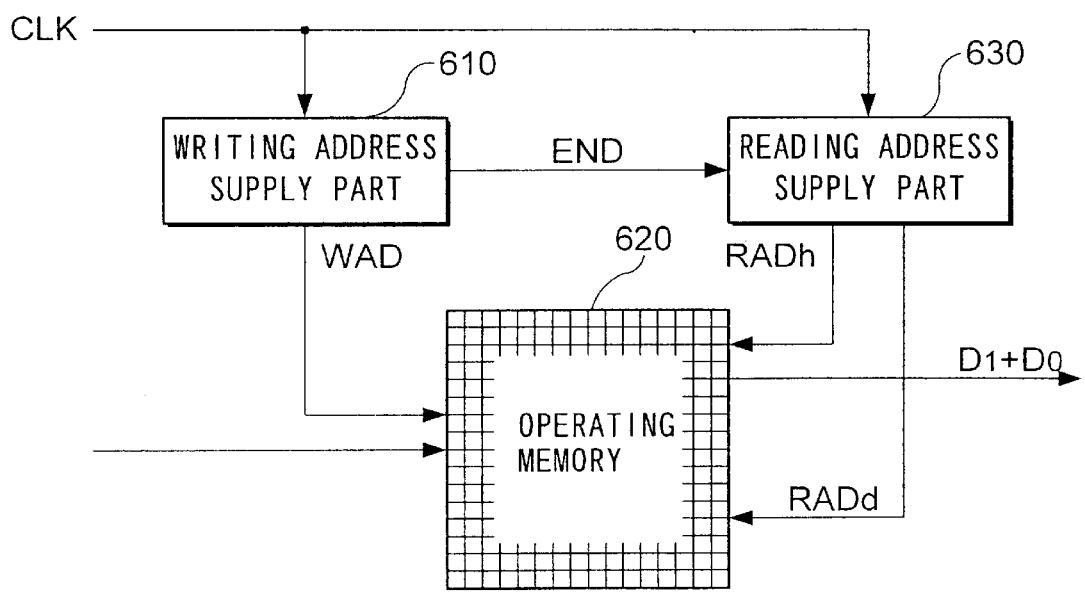
FIG. 10 is a block diagram showing a configuration of the de-interleaving device provided to the receiving side device in said embodiment.

FIG. 10 is a block diagram showing a configuration of this de-interleaving device.

When interleaving has been implemented in the transmission side device by scattering the bits forming the class data of class k, arranging them within the bit sequence of the class data of another class j, this de-interleaving device restores the class data of the un-interleaved class by removing the bits of the class data of class k from the bit sequence of the class data of class j.

To this de-interleaving device are supplied, synchronously with the bit clock CLK, the (m+1)×p bits forming the bit sequence $D_1$ of the class data of class k and the bit sequence $D_0$ of the class data of class j.

This de-interleaving device comprises a writing address supply part 610, an operating memory 620, and a reading address supply part 630.

Here, the operating memory 620 is a storage device similar to the operating memory 520 in the interleaving device 1.

De-interleaving consists of the process of writing these supplied bits to the operating memory 620, and the process of reading these bits from the operating memory 620 in a sequence that differs from when they were written.

While the bits forming the received frame are being supplied to the operating memory 620 synchronously with the bit block CLK, the writing address supply part 610 executes a specified address-generating program to generate the writing address WAD, supplying it to the operating memory 620 synchronously with the bit clock CLK.

This writing address supply part 610 possesses a configuration identical to that of the reading address supply part 530 in the interleaving device (see FIG. 6).

Moreover, in the case of this writing address supply part 610, the counting of the bit clock is carried out by the (m+1)-scale counter, and in addition, the p-scale counter increments its counter value by "1" each time the (m+1)-scale counter yields a count-over. Moreover, a writing address WAD that contains the count value of the p-scale counter as a lower address, and the count value of the (m+1)-scale counter as an upper address is supplied to the operating memory 620 synchronously with the bit clock.

Consequently, as shown in FIG. 8, the initial (m+1) bits are written to each storage area of the first column in the operating memory 620, and then the (m+1) bits are written into each storage area of the second column, and so forth, until the final (m+1) bits (i.e., the pth bit) are written into each storage area of the pth column.

The placement of each bit in the operating memory 620 at this time is in agreement with the position of these bits when they are written to the operating memory 620 of the interleaving device prior to being transmitted from the transmission side device.

When the process of writing all of the bits forming the received frame to the operating memory 620 is completed, the END signal indicating this is supplied to the reading address supply part 630 from the writing address supply part 610.

This reading address supply part 630 possesses a configuration identical to that of the writing address supply part 510 in the interleaving device (see FIG. 5).

Moreover, in the case of this reading address supply part 630, the counting of the bit clock CLK is carried out by the p-scale counter. Moreover, a reading address RADh that contains the count value of the p-scale counter as a lower address, and "0" as an upper address is generated, and supplied to the operating memory 620 synchronously with the bit clock.

Consequently, as shown in FIG. 7, the p bits forming the bit sequence $D_1$ are read from each storage area corresponding to the initial row in the operating memory 620.

Next, in the case of the reading address supply part 630, the counting of the bit clock CLK is carried out by the m-scale counter, and in addition, a count value increment with a count value of the p-scale counter is executed each time the m-scale counter yields a count-over. Moreover, a reading address RADd that contains the count value of the p-scale counter as a lower address, and the count value of the m-scale counter plus "1" as an upper address is generated and supplied to the operating memory 620 synchronously with the bit clock CLK.

Consequently, as shown in FIG. 7, the initial m bits from among the m×p bits forming the bit sequence $D_0$ are read from each storage area corresponding to the (m+1)th row from the second row of the first column in the operating memory 620. Then, the following m bits are read from each storage area corresponding to the (m+1)th row from the second row of the second column in the operating memory 620, and the following m bits are read from each storage area corresponding to the (m+1)th row from the second row of the third column, and so forth, until the final m bits (i.e., the pth bit) are read from each storage area corresponding to the (m+1)th row from the second row of the pth column.

Accordingly, the de-interleaving device performs an operation that is completely the reverse of the interleaving performed in the case of the interleaving device, and restores the original un-interleaved frame.

It should be noted that in the example above, although the case where the bit sequence $D_1$ of class k is formed from p bits and the bit sequence $D_0$ of class j is formed from m×p bits is explained, the case where the number of bits of the bit sequence $D_0$ is not an integer multiple of p is also possible. In this case, for example, it is possible to employ a method such that dummy bits are added to the bit sequence $D_0$ to form a bit length that is an integer multiple of the bit length, and then removing the dummy bits after interleaving is completed.

Moreover, the configurations of the devices for interleaving and de-interleaving described above are, in any case, examples, and devices capable of performing the interleaving and de-interleaving needed in the present embodiment are not limited thereto.

In addition to the above-described basic embodiment, interleaving can be implemented in a variety of embodiments, examples of which are given below. In any case, it is possible to adapt to different circumstances by repeated use of the interleaving device described above. The same applies to the de-interleaving that is needed when various types of interleaving are implemented.

① When, for example, classes 1–3 are classes that are to be interleaved, and classes 4–6 are classes that are not to be interleaved, the bits of the class data of class 1 are scattered and arranged in the bit sequence of the class data of class 4, the bits of the class data of class 2 are scattered and arranged in the bit sequence of the class data of class 5, and the bits of the class data of class 6 are scattered and arranged in the bit sequence of the class data of class 6.

② When, for example, classes 1–3 are classes that are to be interleaved, and classes 4–6 are classes that are not to be interleaved, the bits of the class data of class 1 are scattered and arranged in the bit sequence of the class data of class 4, and then the bits of the class data of class 2 are scattered and arranged in the resulting bit sequence, and then the bits of the class data of class 3 are scattered and arranged in the resulting bit sequence.

A. Second Embodiment

Following is a description of the error protection device relating to the second embodiment of the present invention.

In the first embodiment described above, in cases where a plurality of frames are sequentially delivered to the transmission pathway, it often happens that among the frame-forming data are identical items that exist throughout the frames. For example, the number of bits forming the various classes fall into a number of categories in the various frames, but the encoding ratio of the various classes and the number of error detection bits of the various classes are fixed in the various classes. Accordingly, as in the first embodiment described above, when the fixed data is transmitted to each frame as frame-forming data, the number of bits delivered to the transmission pathway from the synthesizer 104 will increase and be wasted.

Accordingly, in the error protection device relating to this second embodiment, the fixed data among the frame-forming data are sent only at the beginning of the transmission.

Figure 11:
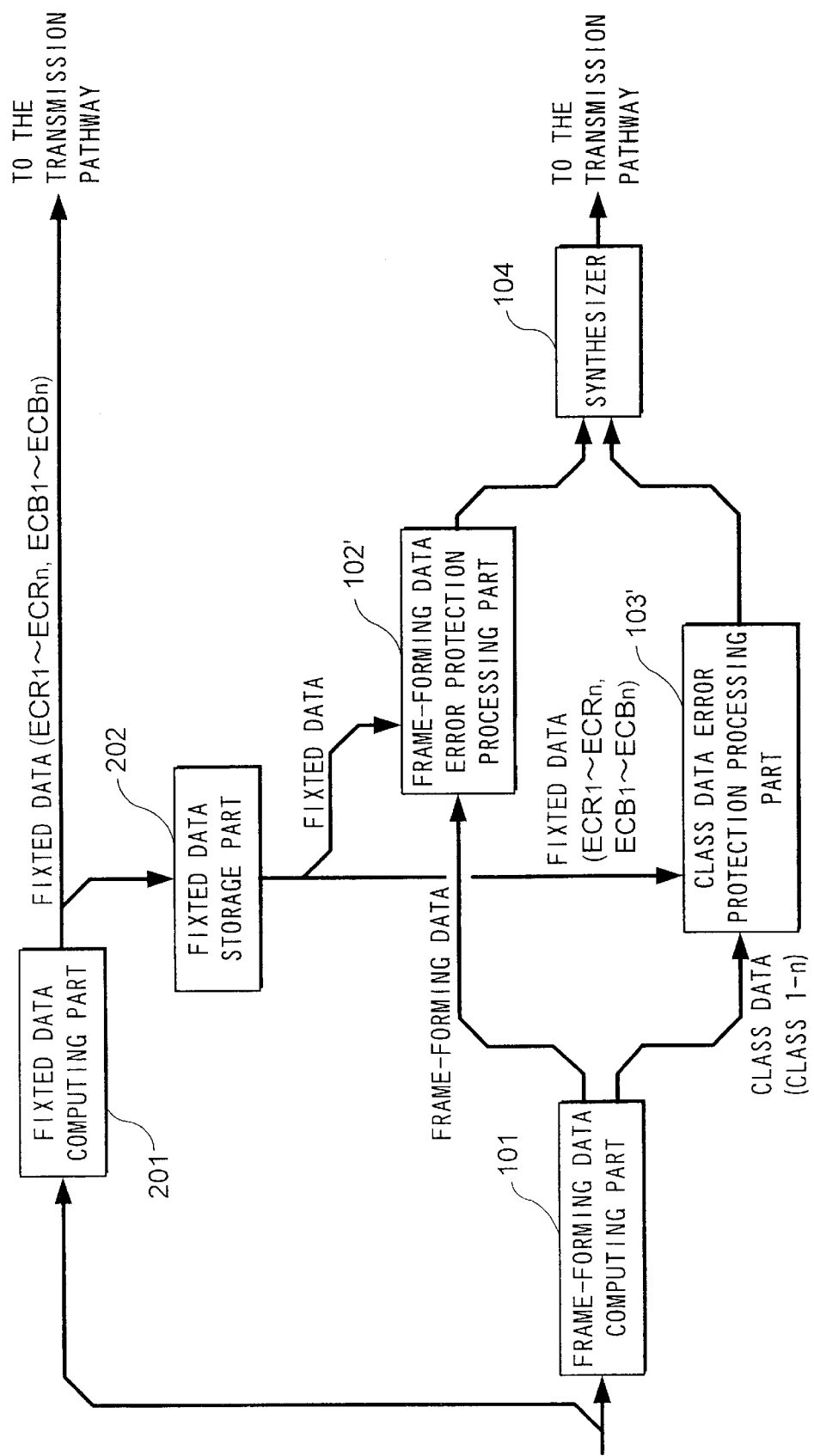
FIG. 11 is a block diagram showing a configuration of the error protection device relating to the second embodiment of the present invention.

FIG. 11 is a block diagram showing this configuration.

In the figure, a fixed data computing part 201 computes the common fixed data in each frame among the frame-forming bits, and this fixed data is transmitted to the receiving side device at the beginning of the transmission. Transmission of this fixed data is accomplished through the use of a telecommunications channel separate from that used for the frames.

Specifically, the fixed data of the present embodiment are the data $ECR_1$–$ECR_n$ indicating the encoding ratio of the error-correcting code applied to each class, and the data $EDB_1$–$EDB_n$ indicating the number of bits of the error detection code applied to each class. Furthermore, the fixed data is preferably configured so that the other side will be sure to receive it, using ARQ (automatic repeat request) or the like.

Next, a fixed data storage part 202 is a device for storing fixed data output by the fixed data computing part 201.

A frame-forming data error protection processing part 102' removes the fixed data stored in the fixed data storage part 202 from the frame-forming data output by the frame-forming data computing part 101, and executes a specified error protection (error correction encoding, the addition of an error detection code, or both) on the remaining frame-forming data. That is to say, the frame-forming data error protection processing part 102' executes error protection only for the data $C_1$–$C_n$ and $CC_1$–$CC_n$ out of the frame-forming data output by the frame-forming data computing part 101.

The class data error protection processing part 103' performs error correction encoding at an encoding ratio specified by the data $ECR_1$–$ECR_n$ which are fixed data stored in the fixed data storage part 202, or adds an error detection code of a number of bits specified by the data $EDB_1$–$EDB_n$ to the class data of the classes 1–n.

The synthesizer 104 gathers the frame-forming data other than the fixed data that has undergone error protection by the frame-forming data error protection processing part 102' and the class data that has undergone error protection by the class data error protection processing part 103', synthesizes them, and transmits them to the recipient via the transmission pathway. It should be noted that the interleaving that is performed on the class data in this synthesizer 104 is of the same type as in the first embodiment.

As described above, in the present embodiment, the fixed data (the data $ECR_1$–$ECR_n$, $EDB_1$–$EDB_n$) of the frame-forming data are sent only at the beginning of the transmission, while during the transmission, the frame-forming data other than the fixed data (the data $CB_1$–$CB_n$, $CC_1$–$CC_n$) are sent in each frame.

The receiving side device receives the fixed data at the beginning of the transmission, after which is received the data output by the synthesizer 104. Then, the configuration of the frame of the received data is determined according to the fixed data initially received and the frame-forming data other than the fixed data received thereafter. That is to say, the encoding ratio of the classes, as well as the number of error detection bits of the classes are determined by fixed data, and moreover, the number of bits of each class, as well as the encoding algorithm of each class, presence or absence or type of interleaving, are determined by frame-forming data other than the fixed data. Therefore, in accordance with these data, data other that the frame-forming data among the received data, i.e., the data that has undergone error correction by the class data error protection processing part 103', is decoded, making it possible to restore the original data.

In accordance with the present embodiment, the fixed data that is common to all the frames is sent only at the beginning of the transmission, rather that at every frame, thereby making it possible to refrain from adding an additional number of bits to be sent from the synthesizer 104 to the transmission pathway.

It should be noted that, with regard to fixed data, although the case of the data $ECR_1$–$ECR_n$ indicating the encoding ratio of each class, and the case of the data $EDB_1$–$EDB_n$ indicating the error detection bit number of each class have been described, the second embodiment is not limited thereto. For example, if the data $CB_1$–$CB_n$ indicating the number of bits forming each class are also fixed data, they can also be included as fixed data. In addition, if only either the data $ECR_1$–$ECR_n$ indicating the encoding ratio of each class, or the data $EDB_1$–$EDB_n$ indicating the number of error detection bits of each class is fixed, those data alone can be used as fixed data.

B. Third Embodiment

Following is a description of the error protection device relating to the third embodiment of the present invention.

In the above-described first embodiment or second embodiment, the content of a portion of the frame-forming data is limited to several types. For example, there is the case where the encoding ratios for error correction encoding capable of being applied to the class data of some classes are only of a few types, or the case where the number of bits of error detection code to be added to the class data of some classes is limited to a few types. Accordingly, in cases where a portion of the content of frame-forming data is limited to a few types, it is thought that the number of bits sent to the transmission pathway will increase and be wasted, as in the first and second embodiments that have a configuration that sends each type of frame-forming data to each frame.

Accordingly, in the error protection device relating to the third embodiment, of the frame-forming data, the types that are limited by the encoding algorithm that is used, are transmitted by the following transmission methods.

a. Regarding frame-forming data of limited types, the frame-forming data of each of these types is sent at the beginning of the transmission, along with an identifier assigned to each.

b. During transmission, the class data of each class that has undergone error protection is sent together with an identifier for designating the frame-forming data corresponding to each, and additional data.

Figure 12:
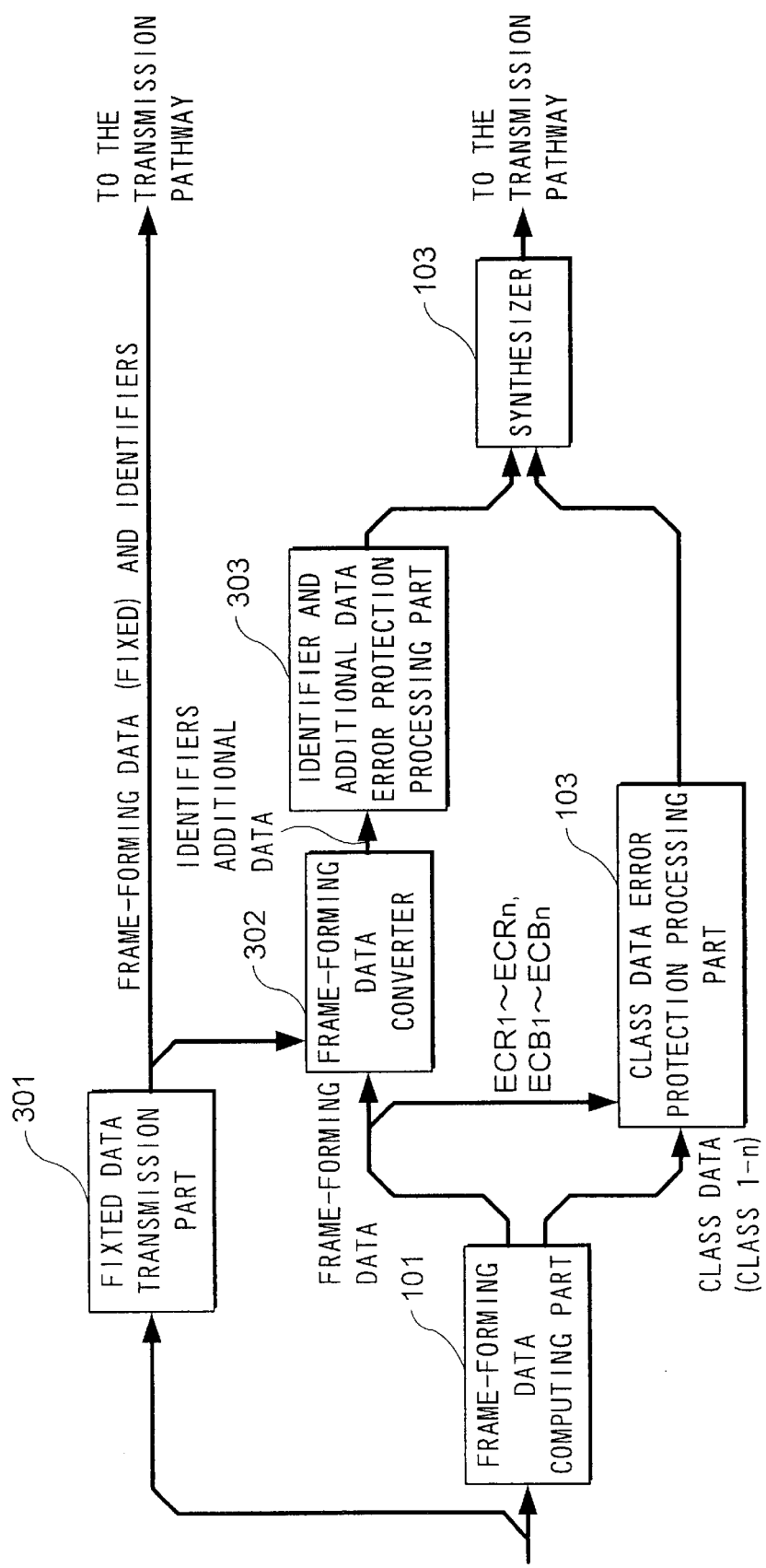
FIG. 12 is a block diagram showing a configuration of the error protection device relating to the third embodiment of the present invention.

FIG. 12 is a block diagram showing a configuration of an error protection device relating to the present embodiment.

In this figure, a fixed data transmission part 301 inputs the data that is to undergo error protection, and it also sends the frame-forming data of the type that are limited to the encoding algorithm that is used, as well as the identifier assigned to each, to the receiving side device, using a telecommunications channel separate from that used for the frames at the beginning of the respective transmissions.

For example, if out of the frame-forming data, the encoding ratios of the classes are limited to two types, then two types of data ECR indicating the content thereof, and two identifiers for identifying them are sent, and furthermore, if the error detection bit numbers of the classes are limited to two types, then two types of data EDBR indicating the content thereof, and two identifiers for identifying them are sent. It should be noted that it is desirable that these data be configured so that the other side will be sure to receive it, using ARQ or the like.

The frame-forming data computing part 101 is of the same type as in the first and second embodiments. However, since the class configuration of the frames is not divergent, but limited, as discussed above, a portion of the frame-forming data will also be limited.

A frame-forming data converter 302 performs the following processing by storing the frame-forming data which is the transmission content of the fixed data transmission part 301 and the identifier assigned to each. That is to say, the frame-forming data converter 302 outputs additional data relating to what was sent at the beginning of the transmission, out of the frame-forming data according to the frame-forming data computing part 101, and relating to what was not sent at the beginning of the transmission, namely, what is substituted for the corresponding identifiers. That is to say, out of the frame-forming data, as regards what was sent at the beginning of the transmission and limited by the encoding algorithm that is used, it is not the data indicating the content, but rather, but what is substituted for the corresponding identifier, that is output, as well as other items as additional data.

The identifiers and an additional data error protection processing part 303 execute specified error correction with respect to the additional data and the identifiers from the frame-forming data converter 302. At this time, an error detection code can be added to the configuration.

On the other hand, as in the first embodiment, the class data error protection processing part 103 determines the error detection code and error-correcting code with respect to the classes 1–n separated by the frame-forming data computing part 101.

Moreover, the synthesizer 104 gathers the additional data and the identifiers that have undergone error correction, along with the classes that have undergone error correction, synthesizes them, and transmits them to the recipient via the transmission pathway.

Thus, in the present embodiment, the frame-forming data of types that are limited by the encoding algorithms that are used and the identifiers assigned thereto are transmitted only in the beginning of the transmission, while during the transmission thereafter, the data of each class that has undergone error correction is transmitted along with the identifiers indicating their configurations and additional data.

Therefore, on the receiving side, with respect to those among the frame-forming data of types that are limited by the encoding algorithm that is used, the frame-forming data of these types and the identifiers assigned to each of them are received in the beginning of the transmission, so subsequently, when the data of classes 1–n is received along with the identifier and additional data, it becomes possible to know the class configuration signified by that identifier. Moreover, the recipient receives additional data which was not sent with the initial transmission out of the frame forming data. It thus becomes possible to restore classes 1–n to the original data at the recipient's end.

In accordance with the present embodiment, regarding the frame-forming data that is of limited types, since it is not the data itself that indicates the content thereof, but the identifier assigned thereto that is transmitted, it becomes possible to greatly reduce the number of bits that are sent from the synthesizer 104 to the transmission pathway.

It should be noted that in the embodiments described above, the frame-forming data error protection processing part 102' in the second embodiment described above is replaced with the frame-forming data converter 302 and identifier and the additional data error protection processing part 303, but the frame-forming data error protection processing part 102 of the first embodiment can also be replaced by the frame-forming data converter 302 and identifier and the additional data error protection processing part 303. In this case, since fixed data is not sent, the frame-forming data converter 302 converts to an identifier that part of the data sent together with the identifier initially out of the frame-forming data output for each frame from the frame-forming data computing part 101, and the other parts are output as additional data.

In addition, regarding the error protection device relating to the first through the third embodiments, in addition to the hardware-type configuration shown in the drawings, it is also possible to realize a configuration from a software standpoint. In order to realize a configuration from a software standpoint, it is possible to execute a program with the same operation as above, using a personal computer and a workstation.

Furthermore, in the error protection device relating to the first through the third embodiments, the frames are sorted by class according to the error sensitivity of various parameters, but the present application is not limited thereto, and the frames can apply widely to classes, that is to say, to blocks that are partitioned by slots and the like.

Moreover, the frame-forming data can also contain data indicating the configuration of the class, such as the number of bits of each class, as well as data indicating the position of each class.

What is claimed is:

1. An error protection method comprising the steps of:
    sorting a plurality of types of parameters forming frames into a plurality of classes;
    generating frame-forming data containing data establishing for each class an error protection method to be applied to each of said parameters and data relating to forming said frames;
    executing specified error protection for said frame-forming data;
    executing error protection that is specified for each class according to said frame-forming data, with respect to parameters sorted into the said plurality of classes; and
    transmitting parameters that have undergone said error protection established for each said class and frame-forming data that have undergone said specified error protection.

2. An error protection method of claim 1, wherein the data relating to the formation of said frames contains the number of bits of the parameters belonging to each class.

3. An error protection method of claim 1, wherein the data that determines for each class the method of error protection to be applied to each said parameter contains of an encoding ratio of an error-correcting code to be applied to the parameters belonging to each class, a number of bits of the error detection code, and at least one data relating to the execution of interleaving.

4. An error protection method of claim 1, wherein fixed data common to each frame is determined from among a plurality of frame-forming data, and then sent at the beginning of the transmission, after which items removed from said fixed data are sent from the frame-forming data to each frame.

5. An error protection method of claim 4, wherein said fixed data expresses at least one of a number of bits of the parameters belonging to each class, the encoding ratio of the error correction code applied to each class, and a number of bits of the error detection code applied to each class.

6. An error protection method of claim 1, wherein a portion of the frame forming information is restricted within a plurality of data, the method further comprising the steps of:
    a. transmitting a plurality of limited types of data relating to a portion of said frame-forming data and an identifier assigned to each, at the beginning of the transmission,
    b. subsequently transmitting an identifier corresponding to said data, relating to items in agreement with each of the data transmitted together with said identifiers out of the frame-forming data generated for each frame, and transmitting other data as additional data.

7. An error protection device, said device comprising:
    a frame-forming data computing part that sorts a plurality of types of parameters forming frames into a plurality of classes, and then generates frame-forming data that includes data relating to the configuration of said frames and data establishing for each class an error protection method to be applied to said parameters;
    a frame-forming data error protection processing part that performs specified error correction on said frame-forming data;
    a class data error protection processing part that implements error protection established for each class according to said frame-forming data, with respect to the parameters sorted into said plurality of classes; and
    a synthesizing part that transmits parameters that have undergone error protection established for each said class and frame-forming data that have undergone said specified error protection.

8. An error protection device of claim 7, wherein there is provided means for determining the data common to each frame from among the frame-forming data, and then sending at the beginning of the transmission;
    said frame-forming data error protection processing part implements error protection for items with said fixed data removed from said frame-forming data for each frame; and
    said class data error protection processing part implements error protection on the parameters belonging to each class, according to said fixed data or said frame-forming data.

9. An error protection device of claim 7, further comprising:
    means for sending a plurality of various types of limited data and identifiers corresponding thereto, regarding a portion of said frame-forming data at the time of transmission, in the case where a portion of said frame-forming data is in some way limited from among the plurality of types of data;
    a frame-forming data converter that converts a portion of the frame-forming data to the identifiers corresponding to the data, the portion being in agreement with any of the data sent together with said identifiers from among the frame-forming data output to each frame from said frame-forming data computing part, and that outputs the other data as additional data; and
    means for implementing specified error protection on the identifiers or additional data output from said frame-forming data converter, instead of said frame-forming data error protection processing part.

10. An error protection device of claim 9, wherein there is provided means for determining the data common to each frame from among said frame-forming data, and then sending at the beginning of the transmission, said frame-forming data converter removes said fixed data from the frame-forming data output to each frame from said frame-forming data computing part, converts a portion of the frame-forming data to identifiers corresponding to the data, the portion being in agreement with any of the data sent together with said identifiers from among the remaining frame-forming data, and outputs the other data as additional data.

11. An error protection device of claim 7, wherein there is also provided an interleaving device that performs the interleaving of parameters of each class that has undergone error protection by said class data error protection processing part, and said frame-forming data computing part outputs said frame-forming data that contains data designating the content of the interleaving to be applied to each class, and said interleaving device performs the interleaving of the parameters of each class in accordance with this frame-forming data.

12. An error protection device of claim 11, wherein said interleaving device possesses means for scattering and arranging the bits forming the parameters of a certain class into the bit sequence of the parameters of another class.

* * * * *

UNITED STATES PATENT AND TRADEMARK OFFICE
CERTIFICATE OF CORRECTION

PATENT NO. : 6,434,718 B1  
DATED : August 13, 2002  
INVENTOR(S) : Toshiro Kawahara et al.

It is certified that error appears in the above-identified patent and that said Letters Patent is hereby corrected as shown below:

Title page,
Item [56], References Cited, OTHER PUBLICATIONS, "Pelz R. M." reference, delete "of  the" and substitute -- of the -- in its place.

Column 15,
Line 61, after "contains" insert -- at least one --, and
Line 64, delete "at least one".

Column 16,
Lines 2 and 3,  after "which items" delete "removed from" and substitute -- of said frame-forming data other than -- in its place and in
Line 3, delete "from the frame-forming data to" and substitute -- for -- in its place.

Signed and Sealed this

Twenty-fourth Day of August, 2004

JON W. DUDAS  
*Director of the United States Patent and Trademark Office*